(12) United States Patent
Byeon et al.

(10) Patent No.: US 11,239,251 B2
(45) Date of Patent: Feb. 1, 2022

(54) METHOD OF FORMING THIN LAYERS AND METHOD OF MANUFACTURING A NON-VOLATILE MEMORY DEVICE USING THE SAME

(71) Applicant: SK hynix Inc., Icheon-si (KR)

(72) Inventors: Hye Hyeon Byeon, Icheon-si (KR); Il Young Kwon, Icheon-si (KR); Jin Ho Bin, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/855,766

(22) Filed: Apr. 22, 2020

(65) Prior Publication Data
US 2021/0151459 A1    May 20, 2021

(30) Foreign Application Priority Data
Nov. 14, 2019  (KR) .................. 10-2019-0145651

(51) Int. Cl.
| | |
|---|---|
| *H01L 27/11582* | (2017.01) |
| *H01L 27/11556* | (2017.01) |
| *H01L 21/3115* | (2006.01) |
| *H01L 21/02* | (2006.01) |
| *H01L 21/311* | (2006.01) |

(52) U.S. Cl.
CPC .... *H01L 27/11582* (2013.01); *H01L 21/0217* (2013.01); *H01L 21/31111* (2013.01); *H01L 21/31155* (2013.01); *H01L 27/11556* (2013.01)

(58) Field of Classification Search
CPC ................................................ H01L 27/11582
See application file for complete search history.

(56) References Cited

U.S. PATENT DOCUMENTS

| | | | |
|---|---|---|---|
| 2017/0243879 A1* | 8/2017 | Yu ........................ | H01L 27/1157 |
| 2020/0402994 A1* | 12/2020 | Yang ................. | H01L 29/40117 |

FOREIGN PATENT DOCUMENTS

| | | |
|---|---|---|
| KR | 1020110136273 A | 12/2011 |
| KR | 101161098 B1 | 7/2012 |
| KR | 1020170139208 A | 12/2017 |
| KR | 101946723 B1 | 2/2019 |

OTHER PUBLICATIONS

M. Vila et al., Mechanical properties of sputtered silicon nitride thin films, Journal of Applied Physics, vol. 94, No. 12, American Institute of Physics, Dec. 15, 2003, pp. 7868-7873.

* cited by examiner

*Primary Examiner* — Mounir S Amer
(74) *Attorney, Agent, or Firm* — William Park & Associates Ltd.

(57) ABSTRACT

A method of manufacturing a non-volatile memory device includes forming a gate insulation layer on a semiconductor substrate having a source layer. The method also includes forming a silicon nitride layer having a buffer-treated upper surface on the gate insulation layer, wherein the buffer-treated upper surface of the silicon nitride layer has a hardness higher than a hardness of the silicon nitride layer. The method further includes forming a silicon oxide layer on the buffer-treated upper surface of the silicon nitride layer. The method additionally includes alternately forming additional silicon nitride layers and additional silicon oxide layers on the silicon oxide layer to form a stack structure.

17 Claims, 10 Drawing Sheets

METHOD OF FORMING THIN LAYERS AND METHOD OF MANUFACTURING A NON-VOLATILE MEMORY DEVICE USING THE SAME

CROSS-REFERENCES TO RELATED APPLICATION

The present application claims priority under 35 U.S.C. § 119(a) to Korean application number 10-2019-0145651, filed on Nov. 14, 2019, in the Korean Intellectual Property Office, which is incorporated herein by reference in its entirety.

BACKGROUND

1. Technical Field

Various embodiments may generally relate to a semiconductor fabrication technology, more particularly, a method of forming thin layers and a method of manufacturing a non-volatile memory device using the same.

2. Related Art

A semiconductor device may include a plurality of stacked thin layers. A specific layer of the thin layers may have bonding characteristics with respect to an upper layer and a lower layer of the specific layer. Further, the thin layers may have a uniform thickness.

The thin layers may be used for an electrode, an insulation layer, wiring in a specific element, or sacrificial layers for defining a specific region.

SUMMARY

In accordance with an embodiment of the present disclosure, a method of manufacturing a non-volatile memory device includes forming a first sacrificial layer on a semiconductor substrate and forming a second sacrificial layer on the first sacrificial layer to form a sacrificial structure. The method also includes forming an insulating interlayer on the sacrificial structure. The method further includes alternately forming additional sacrificial structures and additional insulating interlayers to form a stack structure.

In accordance with an embodiment of the present disclosure, a method of manufacturing a non-volatile memory device includes forming a gate insulation layer on a semiconductor substrate having a source layer. The method also includes forming a silicon nitride layer having a buffer-treated upper surface on the gate insulation layer, wherein the buffer-treated upper surface of the silicon nitride layer has a hardness higher than a hardness of the silicon nitride layer. The method further includes forming a silicon oxide layer on the buffer-treated upper surface of the silicon nitride layer. The method additionally includes alternately forming additional silicon nitride layers and additional silicon oxide layers on the silicon oxide layer to form a stack structure.

In accordance with an embodiment of the present disclosure, a method of forming thin layers includes forming a first layer having a first lattice size and forming, on the first layer, a second layer having a second lattice size smaller than the first lattice size. The method also includes buffer-treating an upper surface of the second layer to provide the upper surface of the second layer with a hardness higher than a hardness of other portions of the second layer. The method further includes forming a third layer having the first lattice size and a material same as a material of the first layer, on the buffer-treated upper surface of the second layer.

In accordance with an embodiment of the present disclosure, a method of manufacturing a non-volatile memory device includes forming a sacrificial structure including different layers on a semiconductor substrate and forming an insulating interlayer on the sacrificial structure. The method also includes alternately forming additional sacrificial structures and additional insulating interlayers to form a stack structure.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings are described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, presented embodiments should not be construed as limiting the present teachings. Although a few embodiments of the present teachings are shown and described, it will be appreciated by those of ordinary skill in the art that changes may be made in these embodiments without departing from the principles and spirit of the present teachings.

Figure 1:
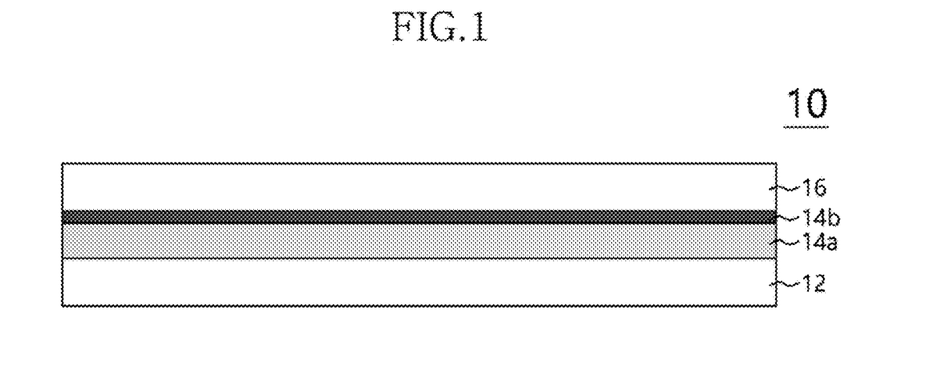
FIG. 1 is a cross-sectional view illustrating a thin layer structure in accordance with example embodiments.

FIG. 1 is a cross-sectional view illustrating a thin layer structure in accordance with example embodiments.

Referring to FIG. 1, a thin layer structure 10 of example embodiments may include a first layer 12, a second layer 14, and a third layer 16 sequentially stacked.

The first layer 12 and the third layer 16 may include substantially the same material. The second layer 14 may include a material different from the material of the first and third layers 12 and 16. Further, the second layer 14 may have a second lattice size different from a first lattice size of the first and third layers 12 and 16. For example, the second lattice size of the second layer 14 may be smaller than the first lattice size of the first and third layers 12 and 16. The first and third layers 12 and 16 may include silicon oxide ($SiO_2$). The second layer 14 may include silicon nitride ($Si_3N_4$).

Figure 2:
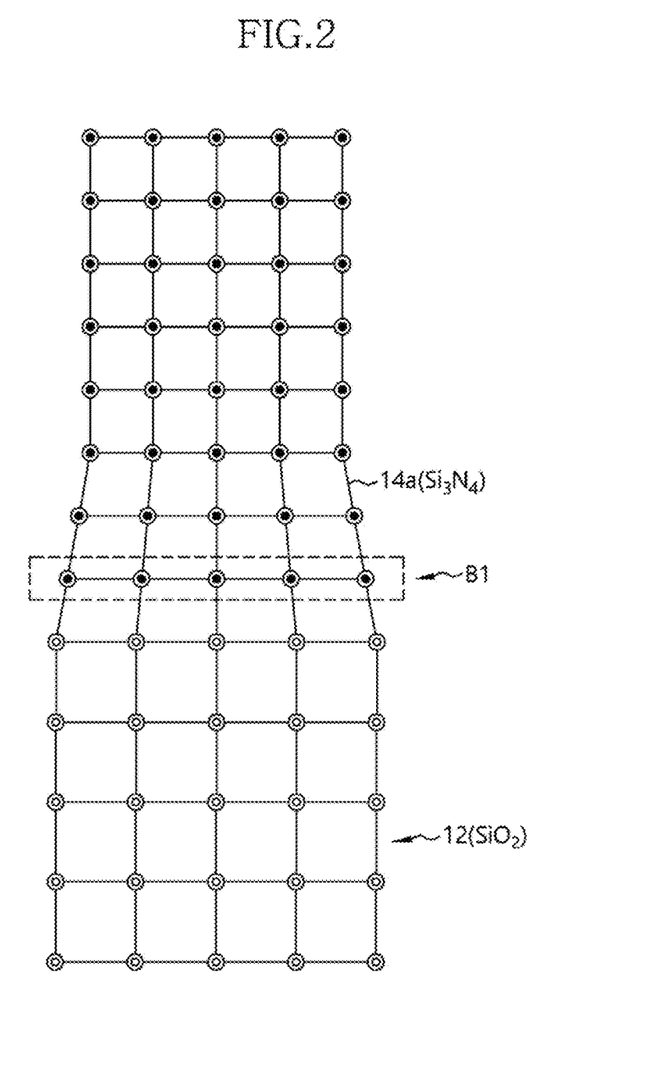
FIGS. 2 and 3 are views illustrating lattice sizes between thin layers in accordance with example embodiments.
Figure 3:
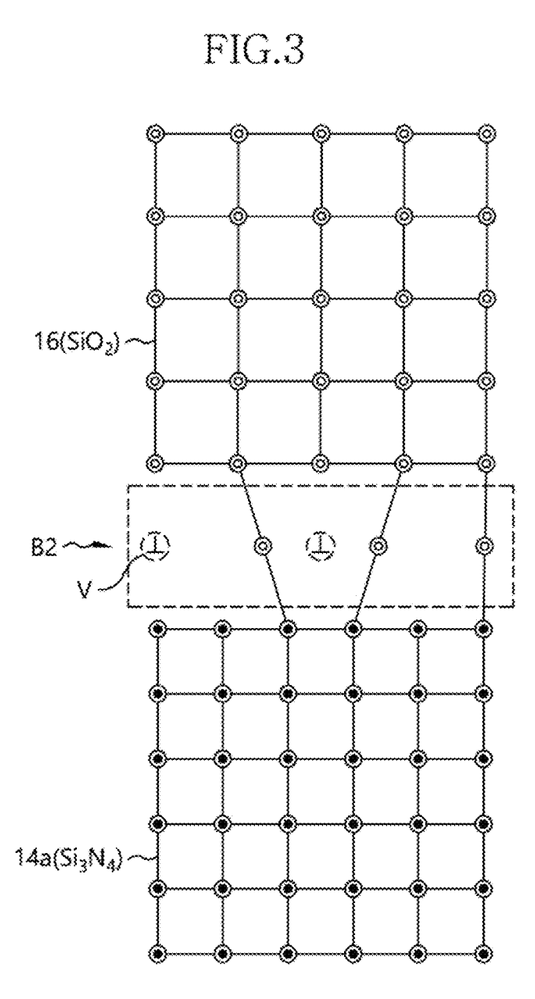

FIGS. 2 and 3 are views illustrating lattice sizes between thin layers in accordance with example embodiments.

Referring to FIG. 2, the first layer 12 including the silicon oxide may have the first lattice size. A second layer 14a including the silicon nitride may have the second lattice size smaller than the first lattice size.

For example, when the second layer 14a may be stacked on the first layer 12, an upper surface of the first layer 12 and a lower surface of the second layer 14a may form a bonding interface. B1 in FIG. 2 may represent the bonding interface.

When the second layer 14a having a relatively large lattice size may be formed on the first layer 12 having a relatively small lattice size, a bonder of the first layer 12 may be compressively arranged to be coupled to a bonder of the second layer 14a so that the bonders of the bonding interface may be mechanically stably arranged. Thus, voids and vacancies might not be generated at the interface between the first layer 12 and the second layer 14.

In contrast, as shown in FIG. 3, when the third layer 16 having the first lattice size may be formed on the second layer 14a having the second lattice size, the bonder of the second layer 14 may be expanded so as to be combined with a bonder of the third layer so that an unstable interface bonding may be generated between the second layer 14a and the third layer 16. Further, a tensile stress may be applied to the bonding interface of the second layer 14a to generate an electric potential defect at the interface B2 between the second layer 14 and the third layer 16. The electric potential defect may cause voids and vacancies V. The voids and the vacancies V may result in generating a micro-crack and a notch between the second layer 14 and the third layer 16.

The micro-crack and the notch may function as an obstacle in providing the second layer 14a with a uniform thickness.

According to example embodiments, in order to improve interface characteristics between the second layer 14a and the third layer 16, as shown in FIG. 1, a buffer layer 14b may be interposed between the second layer 14a and the third layer 16.

The buffer layer 14b may include a material having a same etching selectivity with respect to an etchant for etching the second layer 14 and a hardness greater than a hardness of the second layer 14a. For example, the buffer layer 14b may include a silicon nitride layer including impurities such as carbide, boron, etc. For example, the buffer layer 14b may include SiCN, SiBN, SiCBN, etc.

As indicated above, when the buffer layer 14b having a hardness greater than the hardness of the second layer 14a may be interposed between the second layer 14a configured to receive the tensile stress and the third layer 16 configured to receive the compressive stress, the generation of the voids or the vacancies V may be reduced by a shape maintenance characteristic of the buffer layer 14b, although the tensile stress may be applied to the buffer layer 14b.

In example embodiments, the buffer layer 14b may include a single layer interposed between the second layer 14a and the third layer 16. However, the buffer layer 14b may be interpreted as an upper surface portion having a property different from a property of the second layer 14a. The different property may mean the hardness of the buffer layer 14b is greater than a hardness of the second layer 14a. Hereafter, the treatment of the upper surface portion of the second layer 14a to provide the upper surface portion of the second layer 14a with a hardness greater than the hardness of the second layer 14a may be referred to as a buffer treatment.

Figure 4:
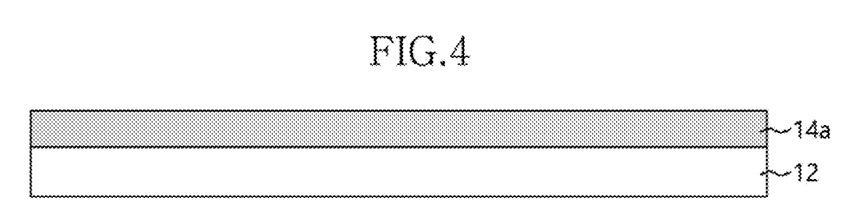
FIGS. 4 to 8 are cross-sectional views illustrating methods of forming thin layers in accordance with example embodiments.
Figure 5:
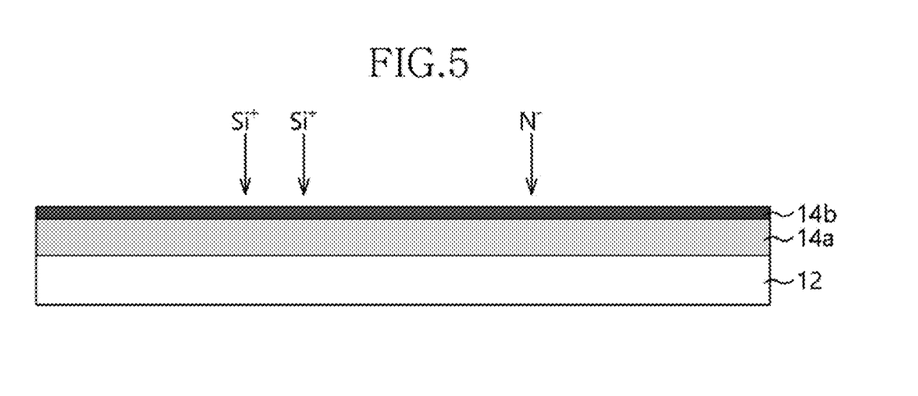

FIGS. 4 and 5 are cross-sectional views illustrating a method of forming thin layers in accordance with example embodiments.

Referring to FIG. 4, the second layer 14a may be formed on the first layer 12. The second layer 14a may have the second lattice size smaller than the first lattice size of the first layer 12. For example, the first layer 12 may include a silicon oxide layer and the second layer 14a may include a silicon nitride layer. The first layer 12 and the second layer 14a may be formed in a same deposition apparatus by an in-situ process. For example, the first layer 12 and the second layer 14a may be formed by a chemical vapor deposition (CVD) process, a plasma enhanced chemical vapor deposition (PECVD) process, an atomic layer deposition (ALD) process, etc. The first layer 12 may be formed by a reaction between a silicon source and an oxygen source. The second layer 14a may be formed by a reaction between a silicon source and a nitrogen source.

For example, the silicon source and the oxygen source may be supplied to form the first layer 12 having a first target thickness. After forming the first layer 12, the supplying of the oxygen source may be stopped. The silicon source and the nitrogen source may then be supplied to form the second layer 14a on the first layer 12.

Referring to FIG. 5, after forming the second layer 14a, a supplied amount of the silicon source (Si+) may be increased while maintaining the supply of the nitrogen source to form the buffer layer 14b. When the buffer layer 14b may be interpreted as a separated layer, the second layer 14a may be interpreted as a preliminary second layer 14a. Further, a sum of a thickness of the preliminary second layer 14a and a thickness of the buffer layer 14b may correspond to a set thickness. Alternatively, the buffer layer 14b may be interpreted as the buffer-treated surface of the second layer 14a.

Although not depicted in drawings, the third layer 16 may be formed on the buffer layer 14b or the buffer-treated surface 14b.

According to example embodiments, the buffer layer 14b or the buffer-treated surface 14b may have the shape maintenance characteristic by the relatively high hardness to reduce the interface separation, although the etchant may infiltrate into the interface. As a result, the generation of defects such as notches and micro-cracks may be decreased.

Figure 6:
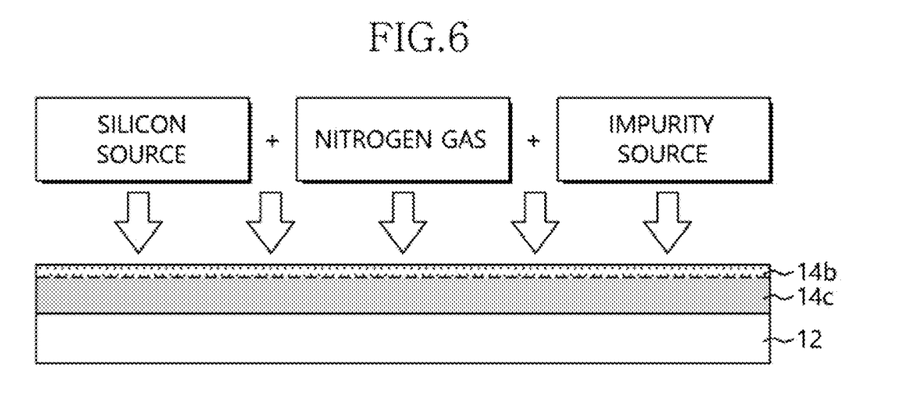
Figure 7:
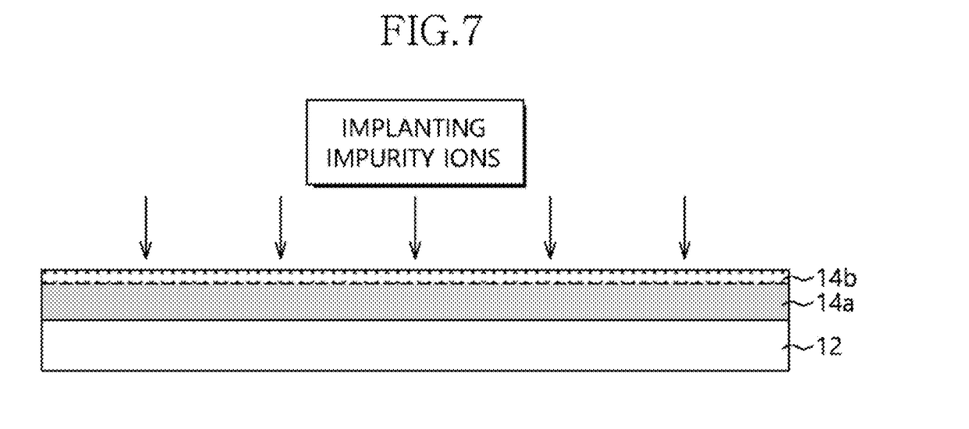
Figure 8:
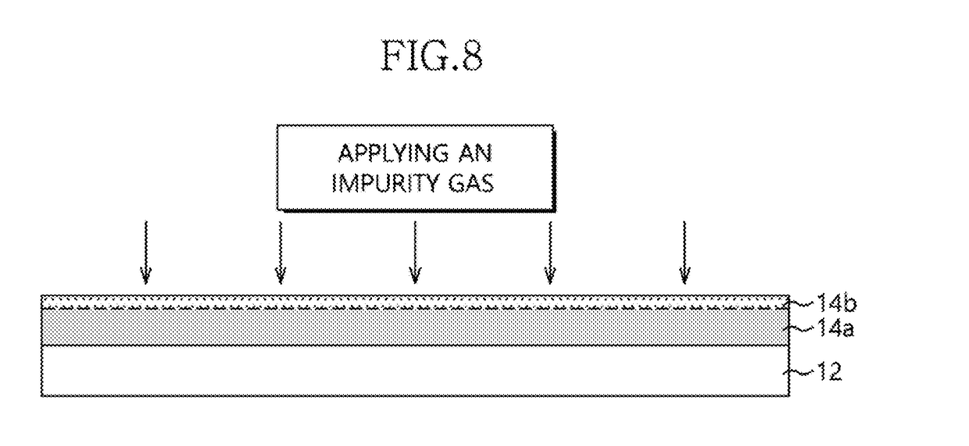

FIGS. 6 to 8 are cross-sectional views illustrating methods of forming thin layers in accordance with example embodiments.

Referring to FIG. 6, the silicon source and the nitrogen source may be supplied to the upper surface of the first layer 12 to form a preliminary second layer 14c. The preliminary second layer 14c may have a thickness of about 50% to about 80% of a target thickness of the second layer 14.

A silicon nitride layer including impurities may be formed on an upper surface of the preliminary second layer 14c to form the buffer layer 14b. The buffer layer 14b may be formed by additionally supplying the silicon source, the nitrogen gas, and an impurity source. The impurity source may include at least one of a carbide source and a boron source. The buffer layer 14b may be formed by an in-situ process with the preliminary second layer 14c. Thus, the buffer layer 14b may include at least one of SiBN, SiCN, and SiBCN. For example, a sum of a thickness of the preliminary second layer 14c and a thickness of the buffer layer 14b may correspond to the target thickness of the second layer 14. The third layer 16 may then be formed on the buffer layer 14b.

Referring to FIG. 7, the second layer 14a may be formed on the first layer 12. Impurities may be implanted into the second layer 14a. The impurities may be activated to form the buffer-treated surface 14b. For example, the impurities may include carbide, boron, etc.

Referring to FIG. 8, the upper surface of the second layer 14a may be treated using a gas including the impurities in place of the implantation of the impurities to form the buffer-treated surface 14b. The gas may include at least one of a $CF_4$ gas, a $C_4F_8$ gas, and $C_4F_6$ gas.

According to example embodiments, the buffer layer 14b or the buffer-treated surface 14b may function to increase the hardness of the silicon nitride layer. Further, impurities in the buffer layer 14b or the buffer-treated surface 14b may replace the void or the vacancy of the bonding interface to reduce defects such as notches and micro-cracks caused by the void and the vacancy V.

The methods of forming the thin layers may be applied to various semiconductor devices. In example embodiments, the methods of forming the thin layers may be applied to a non-volatile memory device.

Figure 9:
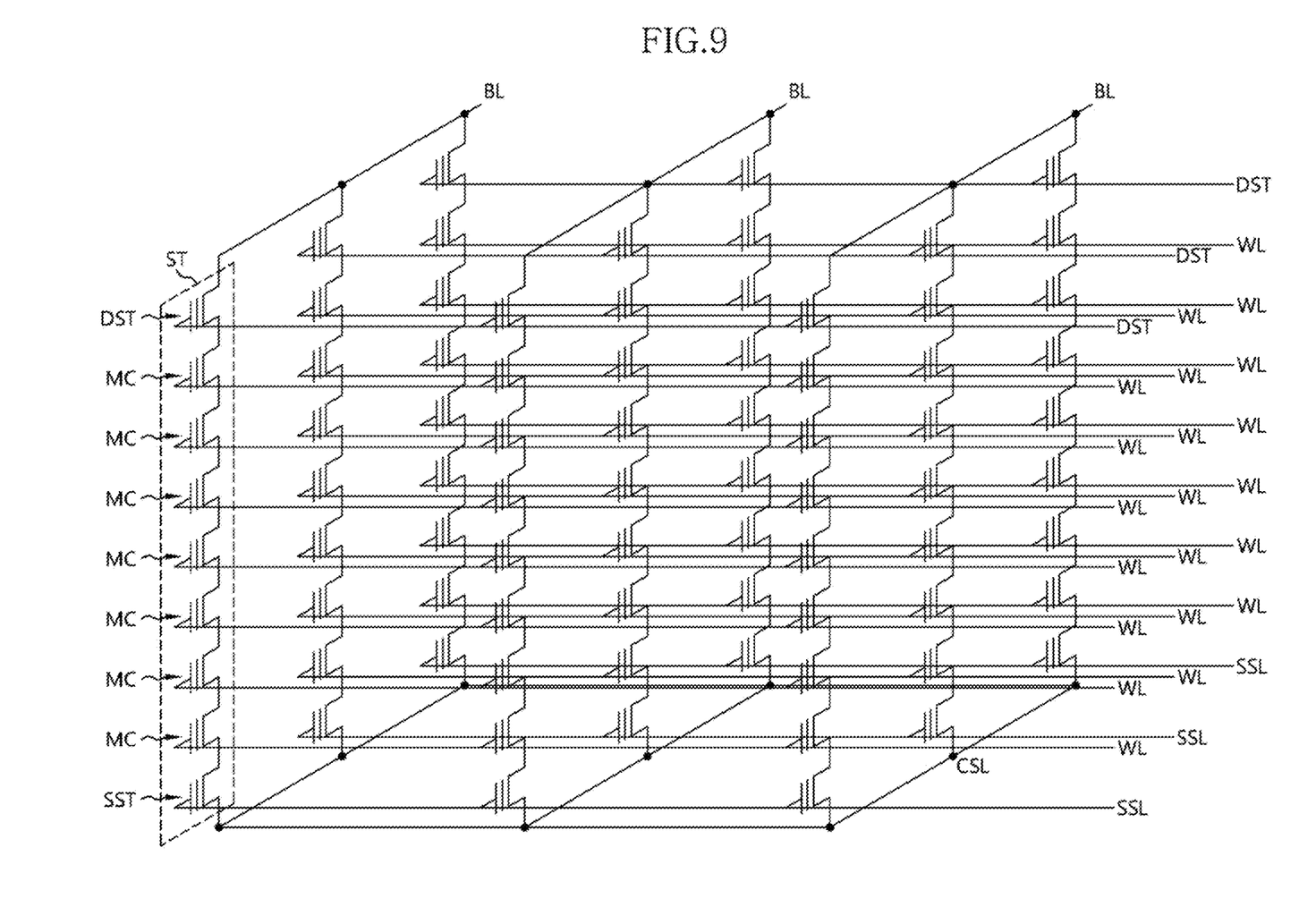
FIG. 9 is a circuit diagram illustrating a non-volatile memory device in accordance with example embodiments.
Figure 10:
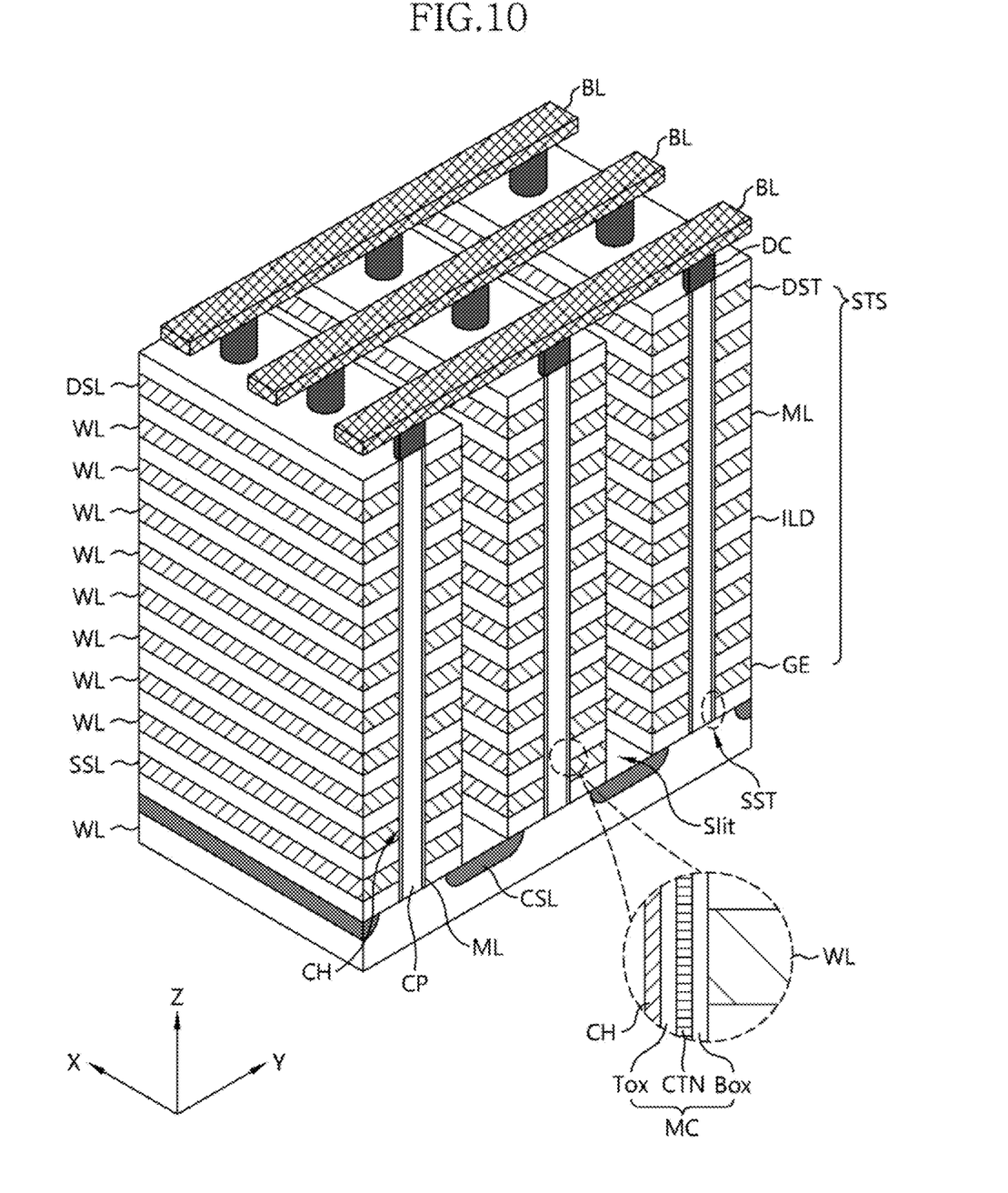
FIG. 10 is a perspective view illustrating the non-volatile memory device in FIG. 9.

FIG. 9 is a circuit diagram illustrating a non-volatile memory device in accordance with example embodiments, and FIG. 10 is a perspective view illustrating the non-volatile memory device in FIG. 9.

Referring to FIG. 9, the non-volatile memory device may include a plurality of strings ST, a plurality of bit lines BL, a plurality of word lines WL, a plurality of drain selection lines DSL, a plurality of source selection lines SSL, and a common source line CSL. Numbers of the strings ST, the bit lines BL, the word lines WL, the drain selection lines DSL, and the source selection lines SSL may be changed in accordance with different kinds of semiconductor devices.

The string ST may be connected between the bit line BL and the common source line CSL. In example embodiments, the three strings ST may be connected to the bit line BL. However, the numbers of the strings ST connected to the bit line BL may be changed. Each of the strings ST may include the source selection transistor SST, a plurality of memory cells MC, and a drain selection transistor DST serially connected with each other. In example embodiments, the eight memory cells MC may be serially connected between one source selection transistor SST and one drain selection transistor DST. However, the numbers of the source selection transistor SST, the drain selection transistor DST, and the memory cells MC connected between the source selection transistor SST and the drain selection transistor DST may be changed. In example embodiments, the memory cell MC and the string ST may correspond to a NAND flash memory cell and a NAND string, respectively.

The source selection transistor SST may selectively connect the common source line CSL with the memory cell MC adjacent to the common source line CSL in accordance with a voltage level of the source selection line SSL.

The drain selection transistor DST may selectively connect the bit line BL with the memory cell MC adjacent to the bit line BL in accordance with a voltage level of the drain selection line DSL.

The memory cells MC in the string ST may be serially connected between the source selection transistor SST and the drain selection transistor DST. Each of the memory cells MC may be selected in response to the word line WL. The selected memory cell MC may perform a read operation, a program operation, and an erase operation in accordance with voltages of the word line WL, the source selection line SSL, the drain selection line DSL, the bit line BL, and the common source line CSL.

Each of the memory cells MC may be configured to store one or more bits. For example, each of the memory cells MC may be used as a single level cell (SLC), a multi-level cell (MCL), or a triple level cell (TLC).

The non-volatile memory device may be integrated on a semiconductor substrate in a three-dimensional structure.

Referring to FIG. 10, a substrate SUB may include a semiconductor material such as silicon including p-type impurities. The common source line CSL may be provided in the substrate SUB. The common source line CSL may be doped with n-type impurities. The common source line CSL may be extended in an X-direction. The common source line CSL may be arranged spaced apart from each other in a Y-direction.

A plurality of stack structures STS may be arranged on the substrate SUB. Each of the stack structures STS may include a conductive layer GE and an insulation interlayer ILD alternately stacked. The stack structures STS may be divided by slits. Each of the stack structures STS divided by the slits may correspond to one block.

The conductive layers GE in the stack structure STS may function as the source selection line SSL, the word line WL, or the drain selection line DSL. For example, in example embodiments, a lowermost conductive layer GE may correspond to the source selection line SSL, and an uppermost conductive layer GE may correspond to the drain selection line DSL. The remaining conductive lines GE between the source selection line SSL and the drain selection line DSL may correspond to the word lines WL of the memory cell MC.

A channel post CP may be formed through the stack structure STS. The channel post CP may be connected to the substrate SUB. The channel post CP may be arranged between the adjacent common source lines CSL. The channel post CP may be arranged in a matrix shape along the X-Y directions. Each of the channel posts CP may have a cylindrical shape extended in a Z-direction.

A channel layer CH and a memory layer ML may be interposed between the channel post CP and the stack structure STS. The channel layer CH may be connected to the channel post CP. The memory layer ML may include a tunnel insulation layer Tox, a blocking insulation layer Box, and a data storage layer CTN. The tunnel insulation layer Tox may make contact with the channel layer CH. The blocking insulation layer Box may make contact with the stack structure STS. The data storage layer CTN may be interposed between the tunnel insulation layer Tox and the blocking insulation layer Box.

A gate insulation layer different from the memory layer ML may be formed between the gate electrode layer GE as the drain selection line DSL and the channel post CP and/or between the gate electrode layer GE as the source selection line SSL and the channel post CP.

One memory cell MC may include one word line WL, the memory layer ML, and the channel layer CH. The word line WL may be configured to surround one channel post CP. The memory layer ML and the channel layer CH may correspond to the corresponding word line WL. The source selection transistor SST may include one source selection line SSL, the memory layer ML, and the channel layer CH. The source selection line SSL may be configured to surround one channel post CP. The memory layer ML and the channel layer CH may correspond to the corresponding source selection line SSL. The drain selection transistor DST may include one drain selection line DSL, the memory layer ML or the gate insulation layer, and the channel layer CH. The drain selection line DSL may be configured to surround one channel post CP. The memory layer ML and the channel layer CH may correspond to the corresponding drain selection line DSL.

A drain contact DC may be formed on the channel post CP. The drain contact DC may include a semiconductor material such as silicon doped with n-type impurities. In example embodiments, the drain contact DC may be positioned on the channel post CP. Alternatively, the drain contact DC may be located on the channel post CP and also in the stack structure STS. The bit line BL extended in the Y-direction may be formed on the drain contact DC.

FIGS. 11 to 16 are cross-sectional views illustrating a method of manufacturing a non-volatile memory device in accordance with example embodiments.

Figure 11:
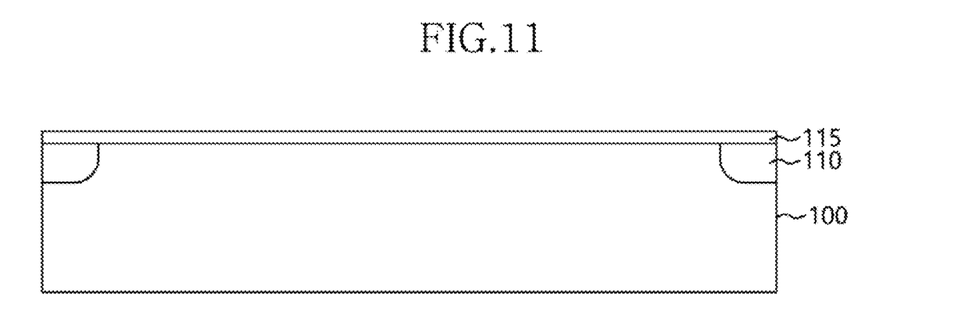
FIGS. 11 to 16 are cross-sectional views illustrating a method of manufacturing a non-volatile memory device in accordance with example embodiments.

Referring to FIG. 11, a source layer 110 may be formed on a semiconductor substrate 100. The semiconductor substrate 100 may include a silicon substrate doped with p-type impurities. The source layer 110 may include an impurity region in the semiconductor substrate 100. The source layer 110 may be formed by activating the n-type impurities. The source layer 110 may include a plurality of linear shapes along the Y-direction. The source layer 110 may correspond to the common source line CSL in FIGS. 9 and 10. A gate insulation layer 115 may then be formed on the semiconductor substrate 110 with the source layer 110. The gate insulation layer 115 may include a silicon oxide layer.

Figure 12:
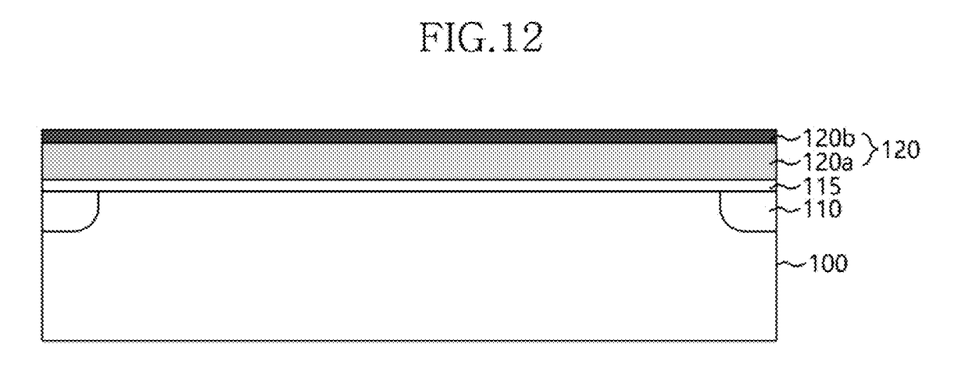

Referring to FIG. 12, a sacrificial structure 120 may be formed on the gate insulation layer 115. The sacrificial structure 120 may include a main sacrificial layer 120a and a buffer sacrificial layer 120b. Alternatively, the sacrificial structure 120 may include a sacrificial layer 120a having a buffer-treated surface 120b. For example, the main sacrificial layer 120a may be formed on the gate insulation layer 115. The main sacrificial layer 120a may include a silicon nitride layer. The main sacrificial layer 120a may be formed by a CVD process, a PECVD process, an ALD process, a PEALD process, etc.

The buffer sacrificial layer 120b may be formed on the main sacrificial layer 120a. The buffer sacrificial layer 120b may have a same etching selectivity with respect to an etchant for etching the main sacrificial layer 120a.

Further, buffer sacrificial layer 120b may have a hardness higher than a hardness of the main sacrificial layer 120a with the same etching selectivity. For example, the buffer sacrificial layer 120b may include a silicon nitride layer (hereinafter, a silicon rich-silicon nitride layer) having a silicon concentration richer than a silicon concentration of the main sacrificial layer 120a. The buffer sacrificial layer 120b including the silicon rich-silicon nitride layer may be formed by an in-situ process with the main sacrificial layer 120a (See FIG. 4).

Alternatively, buffer sacrificial layer 120b may include a silicon nitride layer including impurities having a hardness higher than the hardness of the main sacrificial layer 120a with the same etching selectivity. For example, the impurities may include silicon, carbide, boron, etc. The buffer sacrificial layer 120b including the impurities may be formed by additionally supplying an impurity gas in forming the silicon nitride layer (See FIG. 6). The buffer sacrificial layer 120b including the impurities may be formed by implanting into and then activating the impurities in the silicon nitride layer (See FIG. 7). The buffer sacrificial layer 120b may be formed by treating the surface of the main sacrificial layer 120a using a fluorine carbide gas (See FIG. 8).

Figure 13:
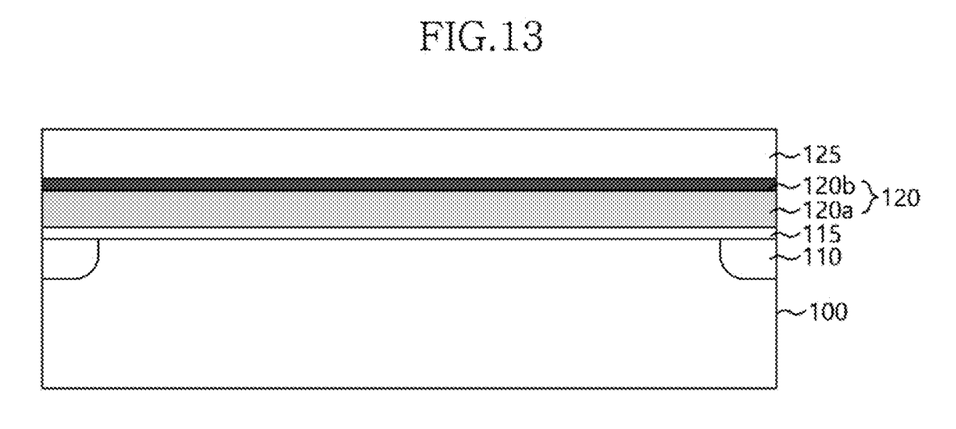

Referring to FIG. 13, an insulation interlayer 125 may be formed on the sacrificial structure 120, particularly, the buffer sacrificial layer 120b. In example embodiments, the insulation interlayer 125 may include an insulating material having an etching selectivity different from an etching selectivity of the sacrificial structure 120. The insulation interlayer 125 may include a silicon oxide layer.

Here, the silicon oxide layer may have a lattice size larger than a lattice size of the silicon nitride layer of the sacrificial structure 120. Thus, when the sacrificial layer includes the silicon nitride layer and the insulating interlayer 125 including silicon oxide may be formed on the silicon nitride layer, the electric potential defect caused by the stress difference may be generated at an interface between the silicon nitride layer and the silicon oxide layer. As a result, a void and a vacancy may be generated at the upper surface of the silicon nitride layer and the lower surface of the silicon oxide layer.

However, according to example embodiments, the sacrificial structure 120 may include the buffer sacrificial layer 120b or the buffer-treated surface 120b on the main sacrificial layer 120a. Thus, the generation of voids and vacancies between the sacrificial layer 120 and the insulating interlayer 125 may be mitigated or suppressed.

When the hardness of the buffer sacrificial layer 120b may be higher than the hardness of the main sacrificial layer 120a, a deflection of the stack structure 120 may be decreased due to the shape maintenance characteristic of the buffer sacrificial layer 120b although a lattice twisting may be generated at the bonding interface. Further, the buffer sacrificial layer 120b and the main sacrificial layer 120a might not be readily separated although the etchant may infiltrate into the interface between the buffer sacrificial layer 120b and the main sacrificial layer 120a. As a result, the generations of the micro-crack and the notch may be reduced.

Further, when the buffer sacrificial layer 120b may include the impurities' density greater than the impurities' density of the main sacrificial layer 120a, the lattice may be narrowed by the impurities, that is, the impurities may be replaced in the vacancy to reduce the micro-crack and the notch.

Figure 14:
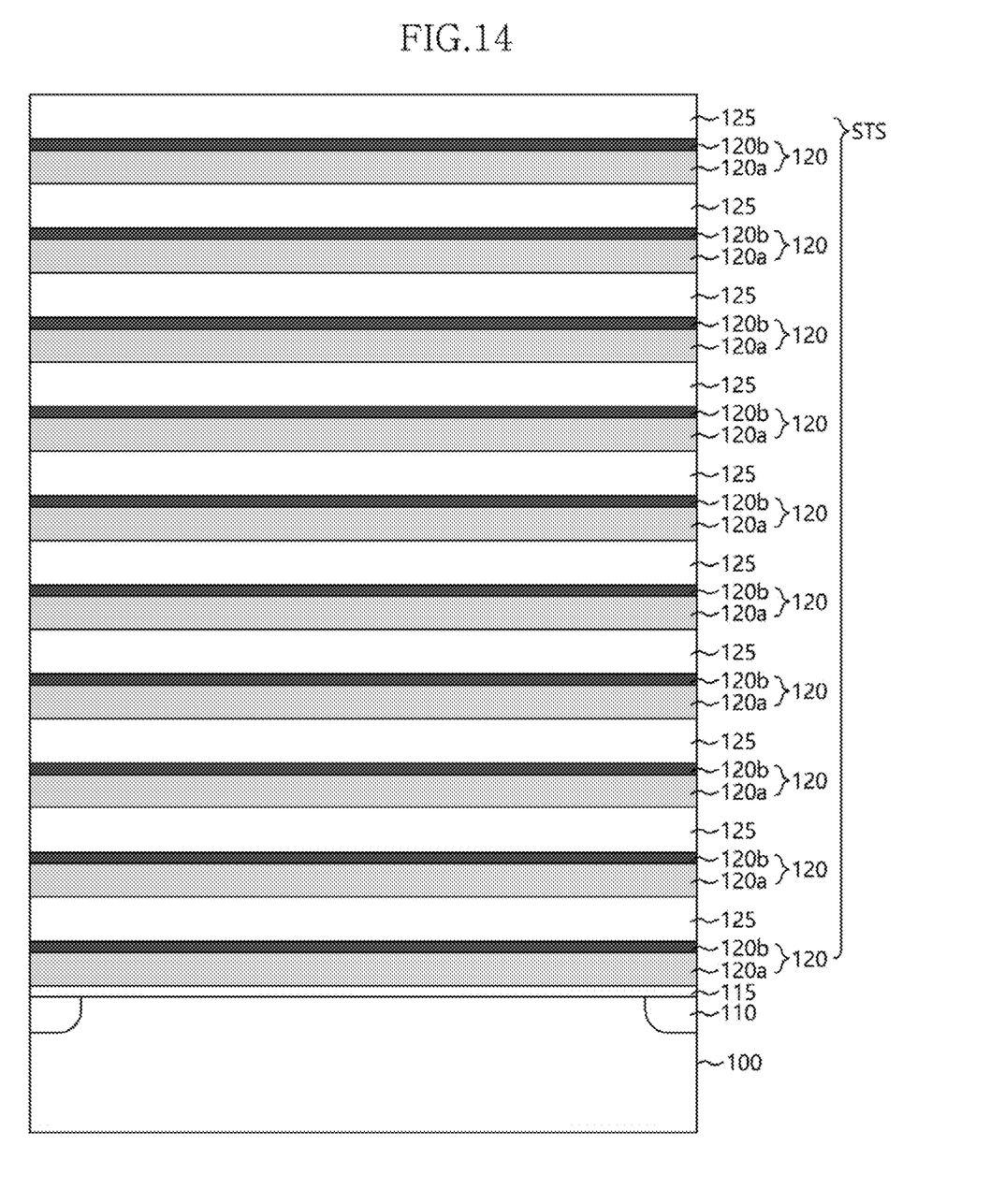

Referring to FIG. 14, the sacrificial structure 120 and the insulating interlayer 125 may be alternately stacked on the insulating interlayer 125 to form a stack structure STS. An uppermost insulating interlayer 125a among the insulating interlayers 125 may have a thickness greater than the thickness of the other insulating interlayers 125.

Figure 15:
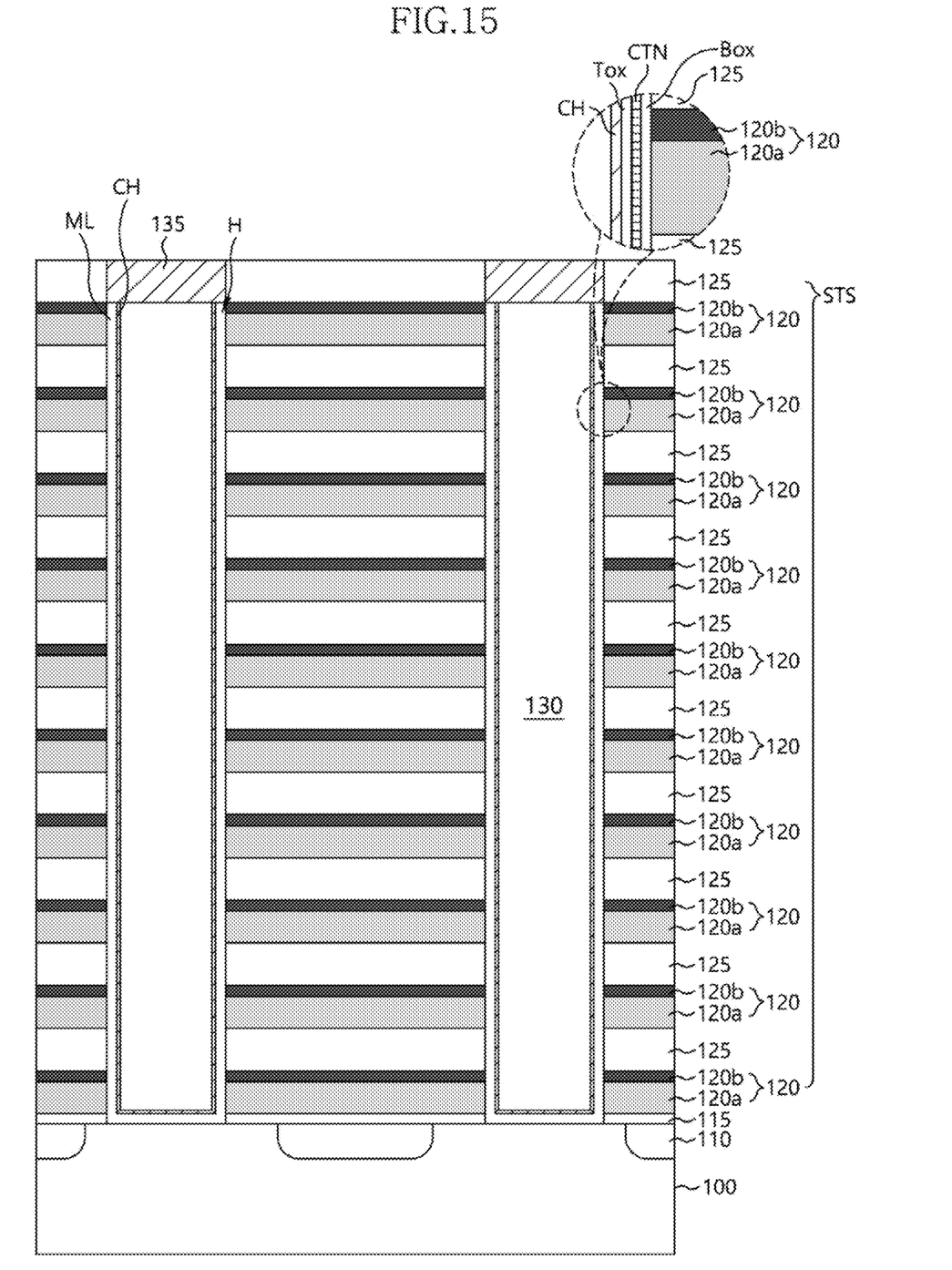

Referring to FIG. 15, a channel post CP may be formed in the stack structure STS. The channel post CP may be formed in a hole H formed through the stack structure STS. The hole H may be configured to expose the semiconductor substrate 100 between the source layers 110.

The hole H may be formed by a plasma dry etching process. In some embodiments, the bonding characteristic between the sacrificial structure 120 and the insulating interlayer 125 may be improved due to the buffer sacrificial layer 120b. Thus, the etching gas for forming the hole H might not infiltrate into the interface between the sacrificial structure 120 and the insulating interlayer 125 to prevent the notch. As a result, the hole H may have an even inner surface vertical to the surface of the semiconductor substrate 110 without the notch of the interface.

Further, forming the channel post CP may include forming a memory layer ML and forming a channel layer CH.

The memory layer ML may be formed on the inner surface of the hole H. As indicated above, because the bonding characteristic between the sacrificial structure 120 and the insulating interlayer 125 may be improved, the hole H may have the even inner surface without the notch or a recessed portion. Thus, the memory layer ML without an uneven portion may also be formed on the inner surface of the hole H.

Here, forming the memory layer ML may include forming a blocking insulation layer Box. The blocking insulation layer Box may include a silicon oxide layer. A data storage layer CTN may be formed on the blocking insulating layer Box. The data storage layer CTN may include a charge-trapping layer, for example, a variable resistance layer including a silicon nitride layer, a silicon layer, a phase change layer, a metal oxide layer, etc. A tunnel insulation layer Tox may be formed on the data storage layer CTN. The tunnel insulation layer Tox may have a thickness less than a thickness of the blocking insulation layer Box. The tunnel insulation layer Tox may include a silicon oxide layer. The memory layer ML may be planarized until the insulating interlayer 125 may be exposed. The planarized memory layer ML may remain in the hole H.

The channel layer CH may be formed on the memory layer ML. The channel layer CH may include a polysilicon layer doped with conductive impurities. The channel layer CH may be planarized to be positioned in the hole H. Because the channel layer CH may be formed on the memory layer ML, the channel layer CH may also not have an uneven portion.

Forming the channel post CP may include forming a core insulation layer 130 and a capping pattern 135 in the hole H.

The core insulation layer 130 may be formed in the hole H in which the memory layer ML and the channel layer CH may be formed. The core insulation layer 130 may include perhydropolysilazane-based inorganic spin-on dielectric (PSZ-SOD) having good gap-filling characteristic. The core insulation layer 130 may be planarized to be positioned in the hole H.

The core insulation layer 130 may be etched until a height of the core insulation layer 130 is lower than a height of the hole H to form a recess in the hole H. For example, a conductive layer may be formed in the recess to form the capping pattern 135. In example embodiments, the capping pattern 135 may be formed in the recess located in the hole H. Alternatively, the capping pattern 135 may be formed on the core insulation layer 130 without forming the recess.

Figure 16:
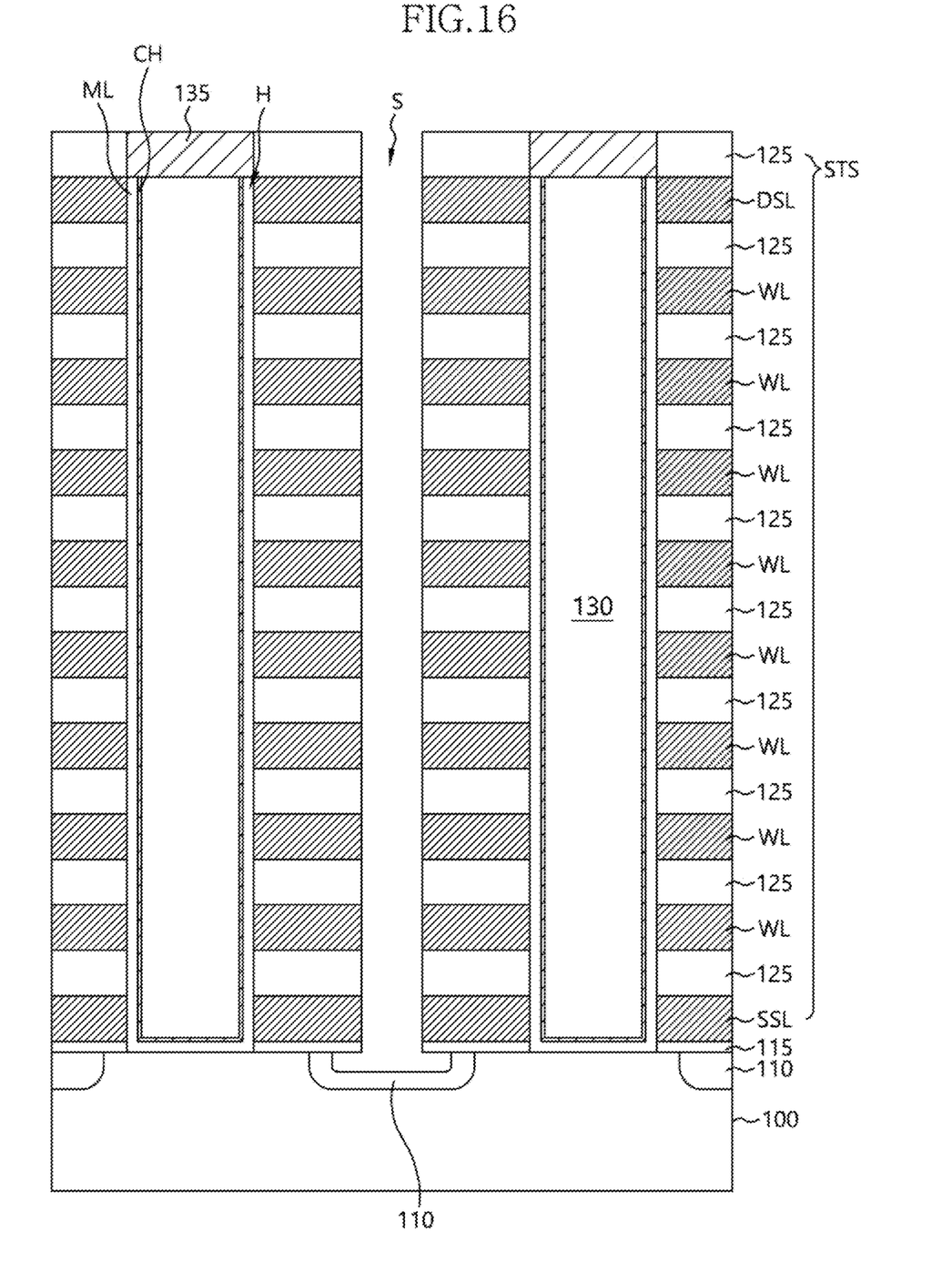

Referring to FIG. 16, a slit S may be formed through the stack structure STS. The slit S may divide a memory cell array of the non-volatile memory device into blocks. For example, the slit S may have a width greater than a width of the hole H. The slit S may be configured to expose the source layer 110.

Sidewalls of the insulating interlayers 125 and 125a and the sacrificial structure 120 may be exposed through the slit S.

The sacrificial structure 120 may be removed using an etchant, for example, a $PH_3$ solution for selectively etching the sacrificial structure 120. Because the main sacrificial layer 120a and the buffer sacrificial layer 120b in the sacrificial structure 120 may have the same etching selectivity with respect to the etchant, the main sacrificial layer 120a and the buffer sacrificial layer 120b may be removed at a same etching speed by the $PH_3$ solution. Thus, a space may be generated between the insulating interlayers 125 and 125a.

Because the bonding characteristic between the sacrificial structure 120 and the insulating interlayers 125 and 125a may be improved, the memory layer ML and the channel layer CH might not infiltrate into the sacrificial structure 120 to provide the space with a uniform shape.

The space may then be filled with a conductive material to rearrange the gate lines SSL, WL and DSL of the memory string.

According to example embodiments, the buffer sacrificial layer or the buffer-treated surface may be formed between the main sacrificial layer including the silicon nitride layer and the insulating interlayer including the silicon oxide layer. The buffer sacrificial layer may be interposed between the main sacrificial layer having the relatively large lattice size and the insulating interlayer having the relatively small lattice size to reduce the stress applied to the main sacrificial layer. Thus, the void and the vacancy might not be generated between the sacrificial structure and the insulating interlayer.

Therefore, because the void and the vacancy might not exist between the sacrificial structure and the insulating interlayer, the etchant for forming the hole through the stack structure might not infiltrate into the stack structure to prevent the generation of the notch. As a result, the sacrificial structure may have the uniform thickness and a uniform shape to provide the word lines with the uniform width and thickness.

The embodiments described above are intended to illustrate and not to limit the present teachings. Various alternatives and equivalents are possible. The present teachings are not limited by the embodiments described herein. Nor are the present teachings limited to any specific type of semiconductor device. Another additions, subtractions, or modifications are obvious in view of the present disclosure and are intended to fall within the scope of the appended claims.

What is claimed is:

1. A method of manufacturing a non-volatile memory device, the method comprising:
   forming a first insulating layer on a semiconductor substrate;
   forming a first sacrificial layer on an upper surface of the insulating layer;
   forming a second sacrificial layer on the first sacrificial layer to form a sacrificial structure, wherein the second sacrificial layer includes the hardness greater than a hardness of the first sacrificial layer;
   forming a second insulating layer on the sacrificial structure, wherein the second insulating layer is formed of a same material as the first insulating layer; and
   alternately forming additional sacrificial structures and additional insulating interlayers to form a stack structure,
   wherein the second sacrificial layer is formed to have different properties from the first sacrificial layer to harden the second sacrificial layer than the first sacrificial layer.

2. The method of claim 1, wherein the first sacrificial layer and the second sacrificial layer have substantially the same etching selectivity with respect to an etchant.

3. The method of claim 1, wherein forming the first and second sacrificial layers comprises:
   supplying a silicon source and a nitrogen source to a chamber for a first time interval to form the first sacrificial layer; and
   increasing a supplied amount of the silicon source while maintaining the supplied amount of the nitrogen source for a second time interval to form the second sacrificial layer.

4. The method of claim 1, wherein forming the first sacrificial layer comprises forming a silicon nitride layer on the upper surface of the insulating layer, and forming the second sacrificial layer comprises forming a silicon nitride layer including impurities for increasing the hardness of the silicon nitride layer constituting the second sacrificial layer on the first sacrificial layer.

5. The method of claim 1, wherein the second sacrificial layer is formed to include impurities for increasing the hardness of the second sacrificial layer, wherein the impurities include at least one of carbide and boron.

6. The method of claim 5, wherein forming the second sacrificial layer comprises:

forming a silicon nitride layer on the first sacrificial layer;
implanting the impurities into the silicon nitride layer; and
activating the impurities in the silicon nitride layer.

7. The method of claim 5, wherein forming the second sacrificial layer comprises:

forming a silicon nitride layer on the first sacrificial layer; and
treating a surface of the silicon nitride layer using a gas including the impurities.

8. The method of claim 1, further comprising:

etching the stack structure until a first region of the semiconductor substrate is exposed to form a hole;
forming a channel post in the hole;
etching the stack structure until a second region of the semiconductor substrate is exposed to form a slit; and
selectively removing the sacrificial structures.

9. A method of manufacturing a non-volatile memory device, the method comprising:

providing a semiconductor substrate having a source layer;
forming a gate insulation layer on the semiconductor substrate;
forming a silicon nitride layer having a buffer-treated upper surface on the gate insulation layer;
forming a silicon oxide layer on the buffer-treated upper surface of the silicon nitride layer; and
alternately forming additional silicon nitride layers and additional silicon oxide layers on the silicon oxide layer to form a stack structure,
wherein the buffer-treated upper surface of the silicon nitride layer has a hardness higher than a hardness of the silicon nitride layer.

10. The method of claim 9, wherein forming the silicon nitride layer having the buffer-treated upper surface comprises:

supplying a silicon source and a nitrogen source to form a preliminary silicon nitride layer; and
increasing a content of the silicon source while maintaining a supplied amount of the nitrogen source to form the buffer-treated upper surface.

11. The method of claim 9, wherein forming the silicon nitride layer having the buffer-treated upper surface comprises:

forming a preliminary silicon nitride layer by a reaction between a silicon source and a nitrogen source;
implanting impurities into an upper surface of the preliminary silicon nitride layer; and
activating the impurities in a periphery of the upper surface of the preliminary silicon nitride layer.

12. The method of claim 11, wherein the impurities comprise at least one of carbide and boron.

13. The method of claim 9, wherein the forming the silicon nitride layer having the buffer-treated upper surface includes;

reacting a silicon source with a nitrogen source to form a preliminary silicon nitride layer; and
treating a surface of the preliminary silicon nitride layer using a gas including impurities.

14. The method of claim 13, wherein the gas including the impurities comprises at least one of a $CF_4$ gas, a $C_4F_8$ gas and $C_4F_6$ gas.

15. A method of forming thin layers, the method comprising:

forming a first layer having a first lattice size;
forming, on the first layer, a second layer having a second lattice size smaller than the first lattice size;
buffer-treating an upper surface of the second layer to provide the upper surface of the second layer with a hardness higher than a hardness of other portions of the second layer; and
forming a third layer having the first lattice size and a material same as the first layer, on the buffer-treated upper surface of the second layer.

16. The method of claim 15, wherein forming the first and third layers comprises forming a silicon oxide layer, and wherein forming the second layer comprises forming a silicon nitride layer.

17. The method of claim 15, wherein buffer-treating the upper surface of the second layer comprises implanting at least one of silicon, boron, and carbide into the upper surface of the second layer.

* * * * *